United States Patent
Hu et al.

(10) Patent No.: US 11,888,021 B2
(45) Date of Patent: Jan. 30, 2024

(54) REDUCED ESR IN TRENCH CAPACITOR

(71) Applicant: Texas Instruments Incorporated, Dallas, TX (US)

(72) Inventors: Jing Hu, Chengdu (CN); Zhi Peng Feng, Chengdu (CN); Chao Zuo, Chengdu (CN); Dongsheng Liu, Chengdu (CN); Yunlong Liu, Chengdu (CN); Manoj K Jain, Plano, TX (US); Shengpin Yang, Chengdu (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/489,199

(22) Filed: Sep. 29, 2021

(65) Prior Publication Data
US 2022/0406885 A1    Dec. 22, 2022

Related U.S. Application Data

(60) Provisional application No. 63/211,615, filed on Jun. 17, 2021.

(51) Int. Cl.
| | |
|---|---|
| *H01L 21/762* | (2006.01) |
| *H01L 49/02* | (2006.01) |
| *H01L 21/324* | (2006.01) |
| *H01L 21/225* | (2006.01) |
| *H01L 21/74* | (2006.01) |
| *H01L 29/94* | (2006.01) |
| *H01L 21/3215* | (2006.01) |

(52) U.S. Cl.
CPC .......... *H01L 28/87* (2013.01); *H01L 21/2253* (2013.01); *H01L 21/324* (2013.01); *H01L 21/32155* (2013.01); *H01L 21/743* (2013.01); *H01L 21/76237* (2013.01); *H01L 28/40* (2013.01); *H01L 29/945* (2013.01)

(58) Field of Classification Search
CPC ..... H01L 28/40; H01L 28/87; H01L 21/2253; H01L 21/32155; H01L 21/324; H01L 21/743; H01L 21/76237; H01L 21/763; H01L 29/945
See application file for complete search history.

(56) References Cited

U.S. PATENT DOCUMENTS

| | | | |
|---|---|---|---|
| 9,337,292 B1 * | 5/2016 | Ali | ............ H01L 21/02164 |
| 10,559,650 B2 | 2/2020 | Jia et al. | |
| 10,586,844 B2 | 3/2020 | Lin et al. | |
| 2007/0015327 A1 * | 1/2007 | Su | ............ H01L 29/66181 |
| | | | 257/E27.095 |

(Continued)

*Primary Examiner* — Ahmed N Sefer
(74) *Attorney, Agent, or Firm* — Andrew R. Ralston; Frank D. Cimino

(57) ABSTRACT

A method of fabricating an integrated circuit includes etching trenches in a first surface of a semiconductor layer. A trench dielectric layer is formed over the first surface and over bottoms and sidewalls of the trenches and a doped polysilicon layer is formed over the trench dielectric layer and within the trenches. The doped polysilicon layer is patterned to form a polysilicon bridge that connects to the polysilicon within the filled trenches and a blanket implant of a first dopant is directed to the polysilicon bridge and to the first surface. The blanket implant forms a contact region extending from the first surface into the semiconductor layer.

18 Claims, 8 Drawing Sheets

(56) References Cited

U.S. PATENT DOCUMENTS

| | | | |
|---|---|---|---|
| 2013/0069198 A1* | 3/2013 | Claeys | H01L 27/016 257/532 |
| 2013/0161792 A1* | 6/2013 | Tran | H01L 29/66083 438/386 |
| 2014/0327109 A1* | 11/2014 | Weng | H01L 29/945 257/534 |
| 2016/0181252 A1* | 6/2016 | Arnold | H01L 27/1203 438/386 |
| 2018/0076276 A1* | 3/2018 | Chou | H01L 21/32053 |
| 2019/0229180 A1* | 7/2019 | Lin | H01L 23/49589 |
| 2019/0229181 A1* | 7/2019 | Jia | H01L 23/49575 |
| 2020/0066922 A1* | 2/2020 | Cheng | H01L 27/016 |
| 2020/0161415 A1* | 5/2020 | Jia | H01L 23/49524 |
| 2021/0005760 A1* | 1/2021 | Hu | H01L 21/76237 |

* cited by examiner

REDUCED ESR IN TRENCH CAPACITOR

CROSS-REFERENCE TO RELATED APPLICATIONS

This non-provisional application claims priority based upon the following prior U.S. provisional patent application(s): (i) "30 V STCAPLV ESR improvement With New Process Integration," Application No. 63/211,615, filed Jun. 17, 2021, in the name(s) of Jing Hu, Zhi Peng Feng, Dongsheng Liu, Chao Zuo, Yunlong Liu, Manoj K Jain, and Shengpin Yang, which is hereby incorporated by reference in its entirety.

SUMMARY

Disclosed implementations provide an integrated circuit with a trench capacitor that may have a lower equivalent series resistance (ESR). Trenches are formed in a surface of a semiconductor layer and a capacitor dielectric is formed on the surface and lining the trenches. A layer of doped polysilicon is deposited over the capacitor dielectric to fill the trenches and is patterned to form a polysilicon bridge that is electrically coupled to the polysilicon in the trenches. An upper plate of the trench capacitor includes the polysilicon within trenches and the polysilicon bridge. A contact region to the lower plate is formed around the polysilicon bridge using a blanket implant of a dopant, providing a larger contact region that extends from the surface into the semiconductor layer. The doping level of the polysilicon layer can be increased by increasing the flow rate of a precursor gas that includes the dopant, while keeping the flow rate of the flow rate of other gases the same. While such implementations may be expected to improve the ESR of the trench capacitors, no particular result is a requirement of the described invention(s) unless explicitly recited in a particular claim.

In one aspect, an implementation of a method of fabricating an integrated circuit is disclosed. The method includes etching trenches in a first surface of a semiconductor layer; forming a trench dielectric layer over the first surface and over bottoms and sidewalls of the trenches; forming a doped polysilicon layer over the trench dielectric layer and within the trenches; patterning the doped polysilicon layer to form a polysilicon bridge that connects to the polysilicon within the filled trenches; and directing a blanket implant of a first dopant to the polysilicon bridge and to the first surface, the blanket implant forming a contact region extending from the first surface into the semiconductor layer.

In another aspect, an implementation of an integrated circuit is disclosed. The integrated circuit includes a semiconductor layer having a first surface; trenches extending from the first surface into the semiconductor layer; a trench dielectric layer lining a bottom and sidewalls of the trenches; a doped polysilicon layer within the trenches, the doped polysilicon layer further forming a polysilicon bridge that extends laterally over the first surface and connects to the doped polysilicon layer within the trenches, a bridge dopant concentration in the polysilicon bridge being greater than a trench dopant concentration in the trenches; and a contact region extending from the first surface into the semiconductor layer and laterally extending away from the polysilicon bridge.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections. Reference to upper and lower elements and similar comparisons are understood to refer to their orientation in the figures provided and is not intended to denote an absolute direction.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific implementations of the invention will now be described in detail with reference to the accompanying figures. In the following detailed description of implementations of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

U.S. Pat. No. 10,559,650, which issued on Feb. 11, 2020 and U.S. Pat. No. 10,586,844, which issued on Mar. 10, 2020, both of which are owned in common with the present application and which are hereby incorporated by reference in their entireties, each disclose a trench capacitor formed in an integrated circuit. These trench capacitors were implemented as vertical capacitors, although the patents also describe the formation of horizontal capacitors. In the context of trench capacitors, a horizontal capacitor is one in which the contacts to both an upper plate and a lower plate of the capacitor are on an upper surface of the chip; a vertical capacitor will have the contact to the lower plate of the capacitor on the lower surface of the chip, i.e., on an opposite surface to the contact for the upper plate.

With an upper terminal at the top of the die and a lower terminal at the bottom of the die, fabrication of the vertical trench capacitors uses five separate masks as part of the process flow: a deep trench mask for etching the trenches, a doped polysilicon mask discussed below, a contact mask for etching openings through a pre-metal dielectric, a metal mask for etching the metal layer, and a passivation mask to form contacts through the passivation layer to the metal layer. As additional trench capacitors are implemented, some applications can preferably use a horizontal capacitor structure with both the terminals on the top side of the surface. Depending on the rest of the chip layout, providing the contact for the lower terminal on the top surface of the chip may use an extra dopant mask and an implant to provide doped contact regions to the lower plate in the substrate, thus requiring an additional mask layer.

Figure 4B:
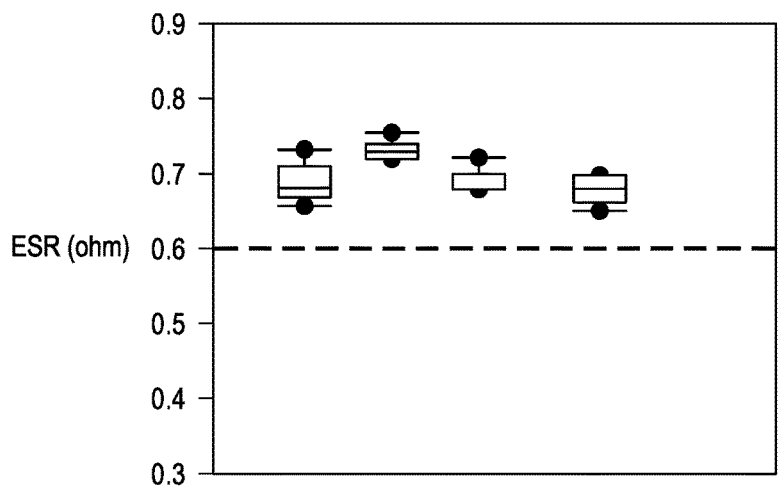
FIG. 4B illustrates the ESR of integrated trench capacitors on a number of wafers fabricated using the baseline implementation of FIG. 4A.
Figure 4A:
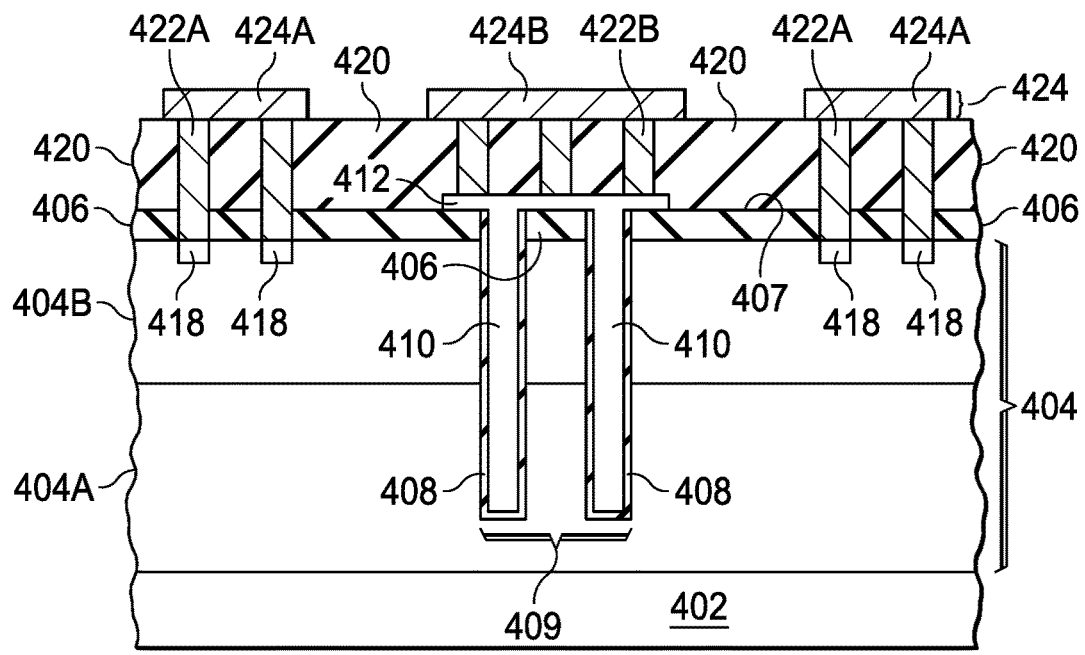
FIG. 4A illustrates a baseline implementation during the development of a 30 V horizontal capacitor.

FIG. 4A depicts a cross-sectional view of an IC 400A containing a baseline 30 V horizontal trench capacitor 401. The IC 400A is briefly described here, while the similarities to and differences from the currently disclosed implementation are provided in greater detail below. A handle substrate 402, which can be a silicon wafer, is shown with a first epitaxial layer 404A over the handle substrate 402 and a second epitaxial layer 404B over the first epitaxial layer 404A. The first epitaxial layer 404A and the second epitaxial layer 404B can be collectively referred to as epitaxial layer 404. A dielectric layer 406, e.g., of silicon dioxide, has been grown or deposited on an upper surface 407 of the epitaxial layer 404.

Trenches 409 have been etched into the epitaxial layer 404, lined with a dielectric layer 408 and filled with a layer of doped polysilicon 410. When the layer of doped polysilicon 410 is etched to remove excess material, a polysilicon bridge 412 is formed over the trenches 409 to conductively couple the polysilicon within the trenches 409. The polysilicon bridge 412 and the doped polysilicon in the trenches 409 together form an upper plate of the horizontal trench capacitor 401 while the handle substrate 402 and the epitaxial layer 404 form the lower plate of the trench capacitor. Substrate contact regions 418 have been formed by implanting a dopant into the epitaxial layer 404. Interconnect dielectric 420 lies over the upper surface 407 of the handle substrate 402. First vias 422A and second vias 422B are formed through interconnect dielectric 420, and a first metal layer 424 having first metal segments 424A and a second metal segment 424B is formed over pre-metal dielectric 420. The first metal segments 424A are coupled to the substrate contact regions 418 through the first vias 422A and the second metal segment 424B is coupled to the polysilicon bridge 412 through the second vias 422B.

FIG. 4B depicts the ESR (equivalent series resistance) for example wafers from four wafers in a same wafer lot in which trench capacitors were fabricated using a representative baseline implementation of IC 400A. The ESR is seen to vary somewhat in capacitors across each wafer and among the wafers in the lot. Data from each wafer are shown as a box plot including a median value. The baseline median ESR values fall at or about 0.7Ω. In some cases, however, it may be desirable to limit the ESR to no greater than 0.6Ω. Examples below describe innovative solutions to reduce the ESR relative to the baseline example.

FIGS. 1A-1F, collectively FIG. 1, illustrate different stages during a process of fabricating an integrated circuit 100 containing a trench capacitor 101, which in the implementation shown is a horizontal capacitor, according to an implementation of the disclosure.

Figure 1A:
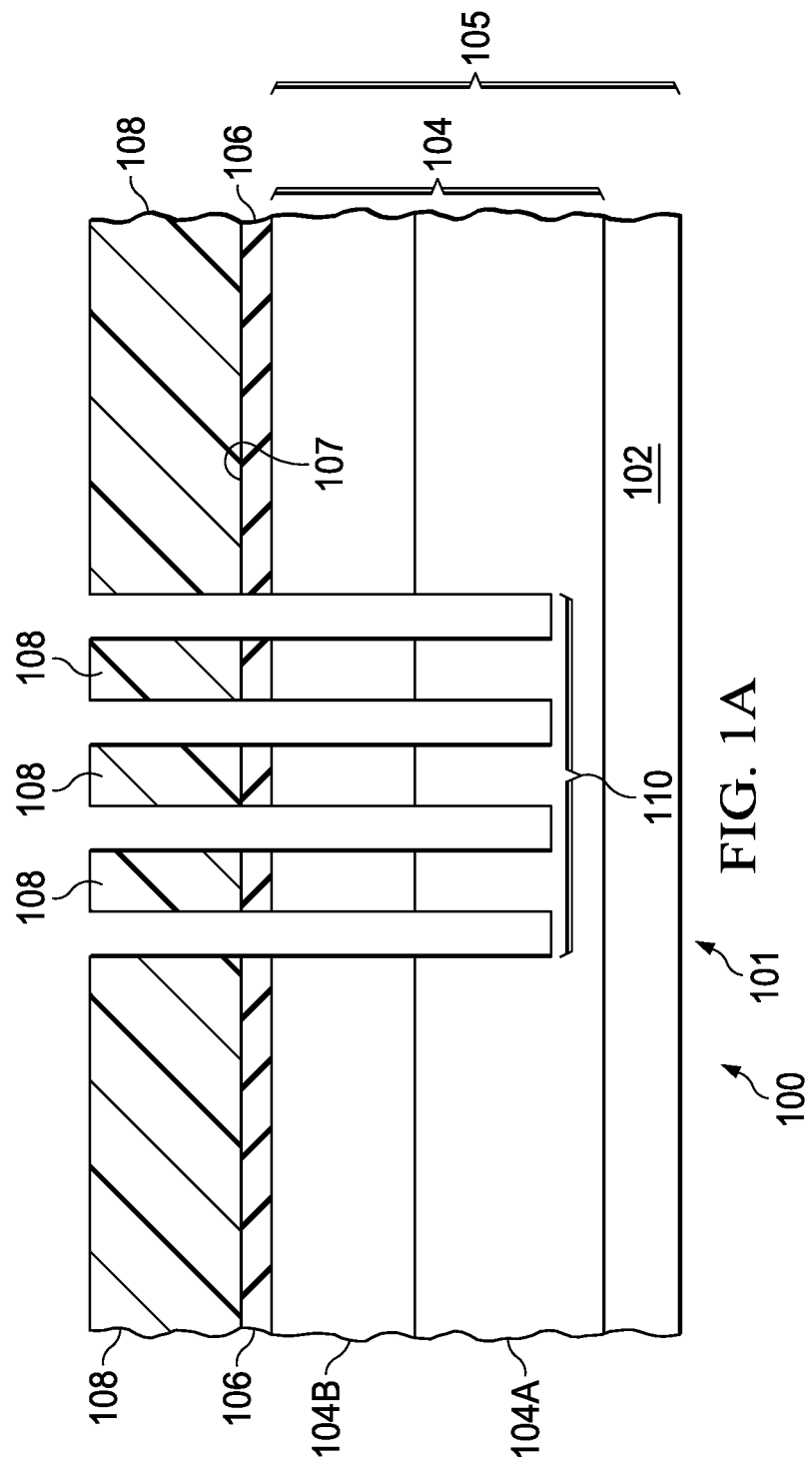
FIGS. 1A-1F illustrate different stages during a process of fabricating an integrated circuit according to an implementation of the disclosure.

FIG. 1A depicts a cross-section of the integrated circuit 100, which contains a handle substrate 102 having an epitaxial layer 104 located over the handle substrate 102. The handle substrate 102 and the epitaxial layer 104 together constitute a semiconductor substrate 105. In one implementation, the handle substrate 102 includes silicon and the epitaxial layer 104 includes a first epitaxial layer 104A and a second epitaxial layer 104B. The epitaxial layer 104 can be grown or deposited using a conventional epitaxial deposition or an atomic layer deposition (ALD), which is a specialized form of epitaxy that typically deposits alternating monolayers of two elements onto a substrate. The thickness and resistivity for the epitaxial layer 104 is generally based on the device performance desired, but the thickness of the epitaxial layer 104 is always greater than the planned depth of trenches 110.

A dielectric layer 106, which generally includes silicon oxide, has been grown or deposited over an upper surface 107 of the epitaxial layer 104. Although the present application depicts the dielectric layer 106 as remaining throughout the fabrication process, the dielectric layer 106 may be fully or partially removed in various processes, e.g., during etching of polysilicon layer 114 discussed below, and replaced at various stages using either thermal growth or deposition. A photoresist layer has been created and patterned to form a patterned photoresist layer 108 that exposes portions of the epitaxial layer 104 where trenches are desired, and the trenches 110 have been etched. Only four trenches 110 are provided in the illustrated example, but it is understood that tens of thousands or hundreds of thousands of trenches may be formed as part of the trench capacitor 101. The depth of the trenches 110 may be in the range of 10 μm to 50 μm, depending on the capacitance density needed, but the trenches 110 are typically formed entirely in the epitaxial layer 104. In one implementation, the capacitance provided can be in the range of about 10 nF to about 50 nF. In one implementation, the patterned photoresist layer 108 can be formed over a hardmask (HM) layer (not explicitly shown), such as high-density plasma (HDP) oxide HM layer, which may be formed on the dielectric layer 106. The HM layer may be used when the patterned photoresist layer 108 is thin or the trenches 110 are so deep that the patterned photoresist layer 108 would be insufficient to protect unpatterned portions of the epitaxial layer 104 during the trench etching process.

As shown in FIG. 1A, the trenches 110 have been formed using anisotropic etching through the dielectric layer 106 and into the epitaxial layer 104, although the trenches 110 do not extend into the handle substrate 102. In at least one implementation, the width of the trenches is between about 0.5 μm to 3 μm, with the trenches spaced apart about 0.3 μm to 1.5 μm. In the context of thickness, the term "about" means±10%.

Figure 1B:
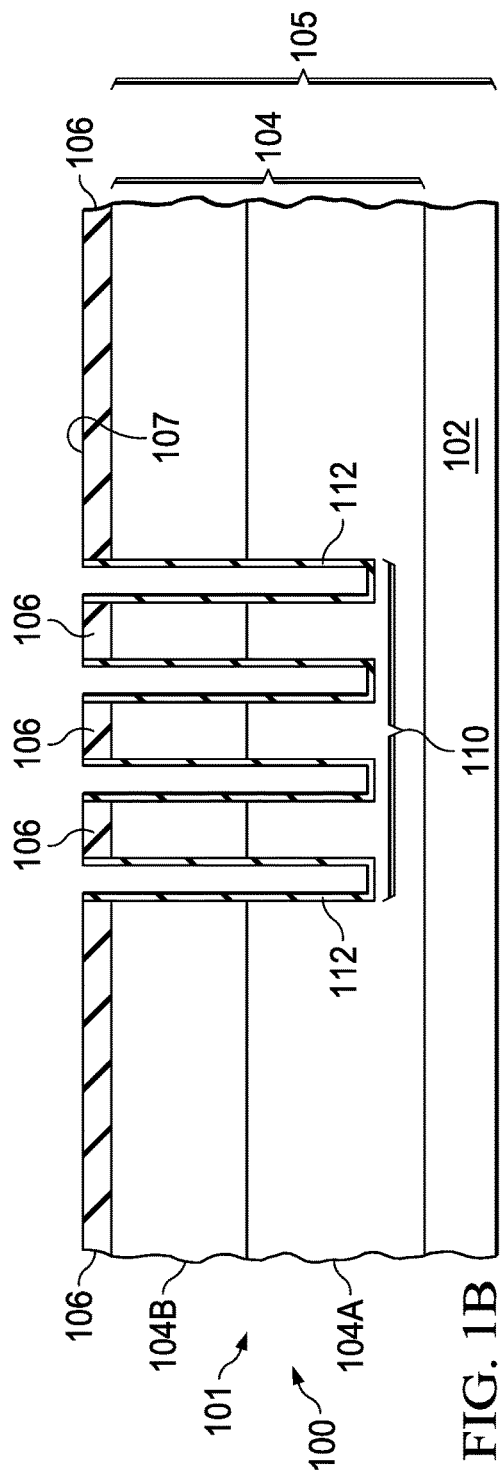

FIG. 1B depicts a cross-section of the integrated circuit 100 after the patterned photoresist layer 108 (FIG. 1A) has been removed and a trench dielectric layer 112 has been deposited or thermally grown on sidewalls and bottom surfaces of the trenches 110. In one implementation, the trench dielectric layer 112 is a single layer that includes silicon oxide. In another implementation, the trench dielectric layer 112 includes two or more dielectric layers. The silicon oxide layer can be, for example, about 200 Å (20 nm) to about 2,000 Å (200 nm) thick. In one implementation, the trench dielectric layer 112 can be about 1,000 Å (100 nm) thick for an operating voltage of about 30 V. In one implementation, the trench dielectric layer 112 includes a silicon oxide/silicon nitride/silicon oxide stack, sometimes referred to as an oxide-nitride-oxide (ONO) stack.

Figure 1C:
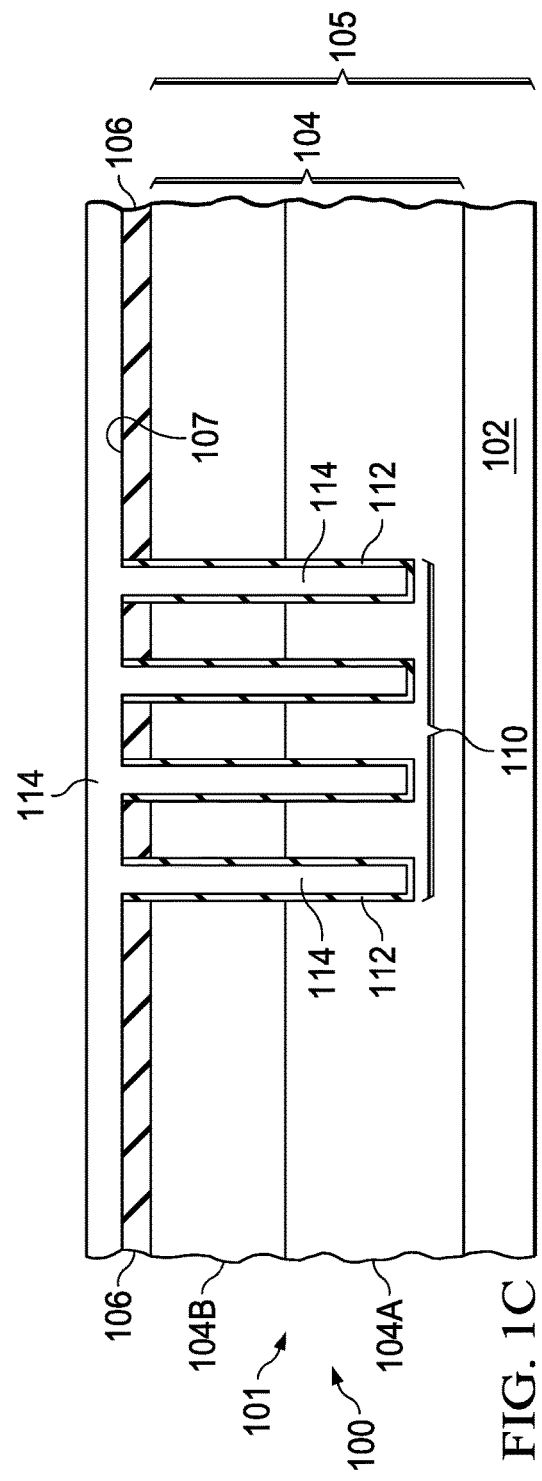

FIG. 1C shows a cross-section of the integrated circuit 100 containing the in-process trench capacitor 101 after a doped polysilicon layer 114 is deposited, in some examples by a low pressure chemical vapor deposition (LPCVD) process, to fill and over fill the trenches 110, which typically involves depositing a thickness of polysilicon that is greater than half the trench width. The doped polysilicon layer 114 can be doped in situ or as a separate later doping step. In one implementation, the polysilicon dopant level may be within a range of about $5\times10^{18}$ atoms/cm$^3$ to about $5\times10^{20}$ atoms/cm$^3$. In the context of dopant concentration, the term "about" means±20%. In a baseline implementation, the deposition of the doped polysilicon layer 114 may be performed in an LPCVD chamber using a flow of silane (SiH$_4$) of about 1200 sccm and a flow of phosphine (PH$_3$) of about 85 sccm. In the context of flow rate, the term "about" means±10%. The temperature for the deposition can be in the range of about 500° C. to about 560° C. In the context of temperature, the term "about" means±5%. In one implementation, the deposition temperature may be about 530° C. In one implementation of the described example, the flow of PH$_3$ is increased from about 85 sccm to about 95 sccm with the flow of SiH$_4$ remaining at about 1200 sccm, resulting in a greater concentration of the phosphorous dopant in the polysilicon. These process conditions may provide a doping level of about $3\times10^{20}$ atoms/cm$^3$ in the doped polysilicon layer 114.

Figure 1D:
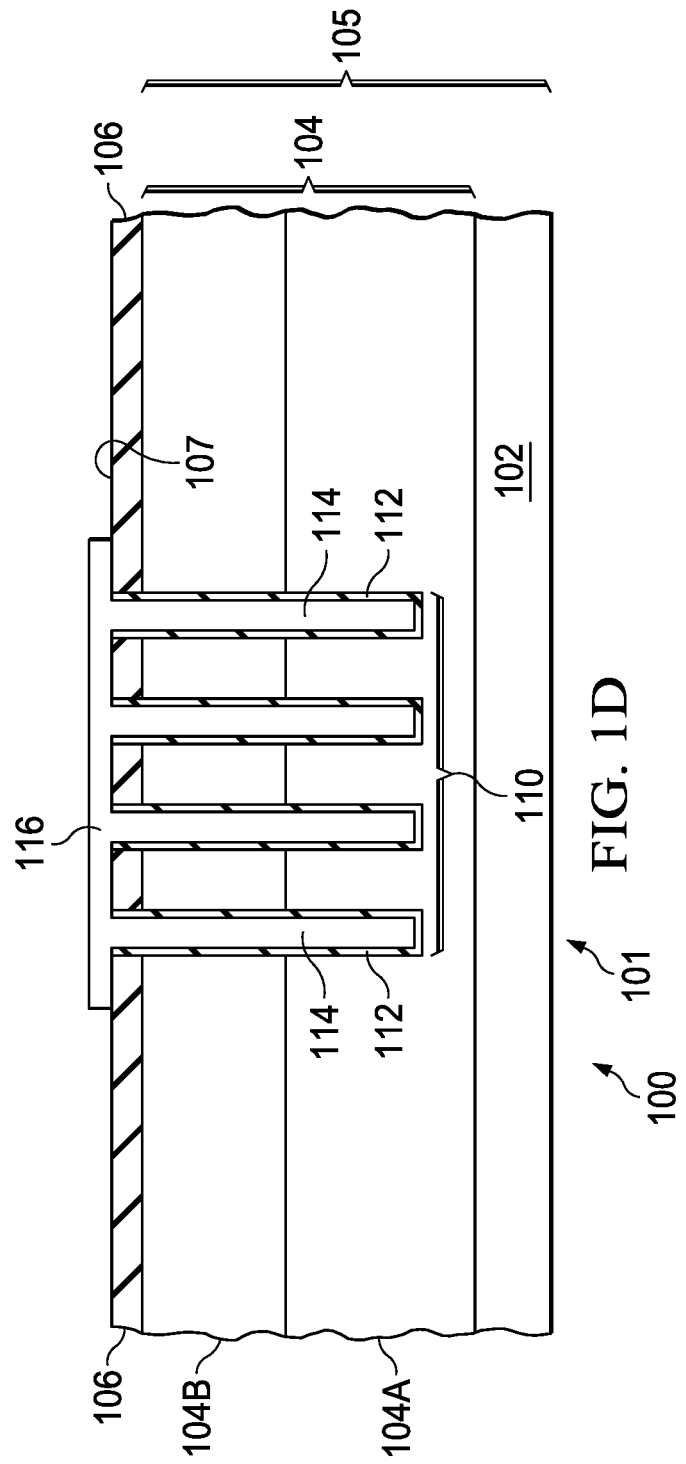

FIG. 1D shows a cross-section of the integrated circuit 100 containing the in-process trench capacitor 101 after the doped polysilicon layer 114 has been patterned and etched to remove portions of the doped polysilicon layer 114 over the dielectric layer 106. A portion of the doped polysilicon layer 114 has been left on the upper surface 107 over the filled trenches to form a polysilicon bridge 116. The polysilicon bridge 116 conductively couples the polysilicon within the filled trenches 110 to form a first plate of the capacitor, while the handle substrate 102 and the epitaxial layer 104 form a second plate; the first plate being separated from the second plate by the trench dielectric layer 112.

Figure 4C:
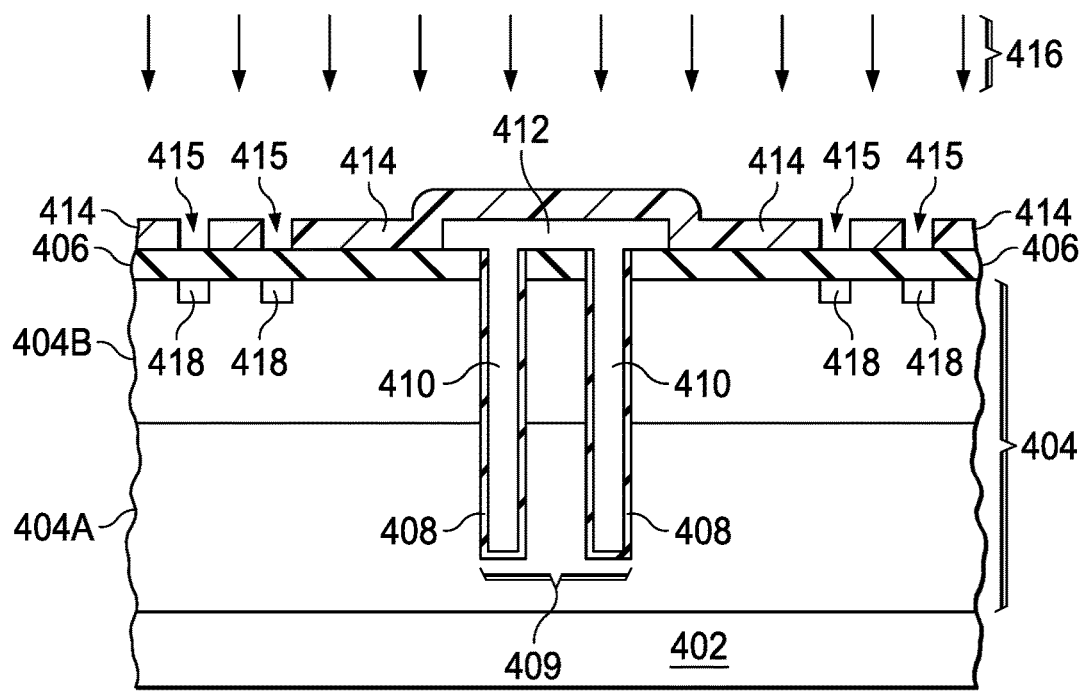
FIG. 4C illustrates an implant stage in the baseline process used to fabricate the integrated circuit of FIG. 4A.

Prior to further discussion of the process sequence depicted in FIG. 1, FIG. 4C is described, which depicts a corresponding stage in some baseline processes. FIG. 4C shows a cross-section of an IC 400C, which contains the in-process horizontal trench capacitor 401. In this implementation, the trenches 409 have been filled with the layer of doped polysilicon 410 and the polysilicon bridge 412 conductively connects the doped polysilicon 410 within the trenches. A patterned photoresist layer 414 has been formed and contains several openings 415 through which dopants can be implanted by an implant 416. The implant 416 dopes the substrate contact regions 418, while other regions of the horizontal trench capacitor 401 are protected from the implant.

Figure 1E:
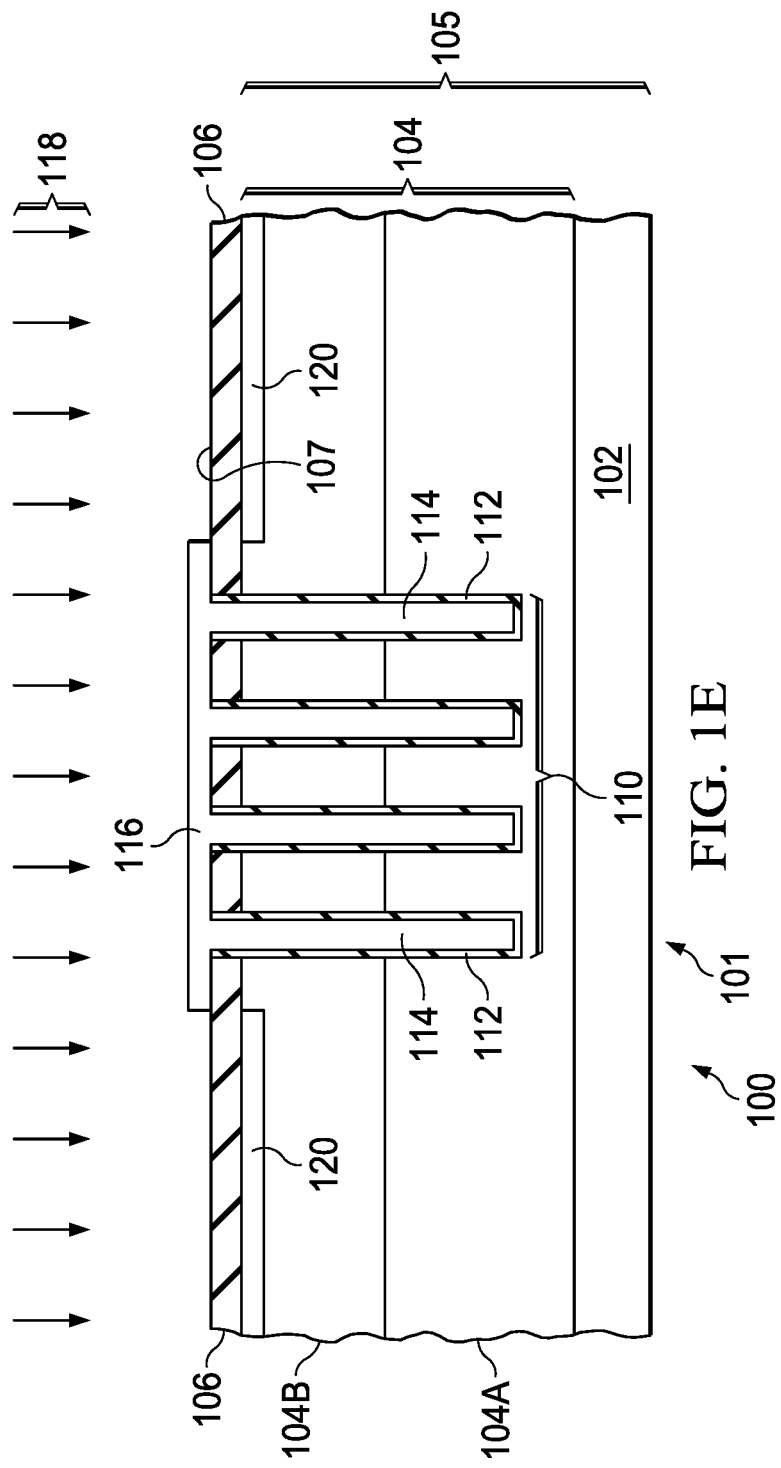

In contrast, as illustrated in FIG. 1E, no photoresist is used to mask the implant 118 in the process of forming the trench capacitor 101. Instead a blanket implant 118 provides a dopant, which in one implementation includes phosphorus, to the entire surface of the integrated circuit 100 proximate the trench capacitor 101. The substrate contact region 120 is thus formed on the upper surface 107 of the handle substrate 102 in all areas that are not covered by the polysilicon bridge 116, while the polysilicon bridge 116 receives additional dopants that can decrease the resistance in the polysilicon bridge 116 and therefore the ESR of the capacitor 101. In one implementation, after the blanket implant 118, the substrate contact region 120 has a contact dopant concentration of about $1\times10^{20}$ atoms/cm$^3$ and the polysilicon bridge 116 has about the same dopant concentration. In one implementation in which the doped polysilicon layer 114 used to form the polysilicon bridge 116 is in situ doped to a dopant concentration of about $3\times10^{20}$ atoms/cm$^3$, the final bridge dopant concentration of the polysilicon bridge 116 is about $4\times10^{20}$ atoms/cm$^3$. It is further noted that when the trench capacitor 101 is implemented as a stand-alone device, e.g. in which no other electronic devices are present on the substrate 105, the photolithographic process used to form the patterned photoresist layer 414 may be advantageously eliminated, reducing a costly step in the fabrication process.

Figure 1F:
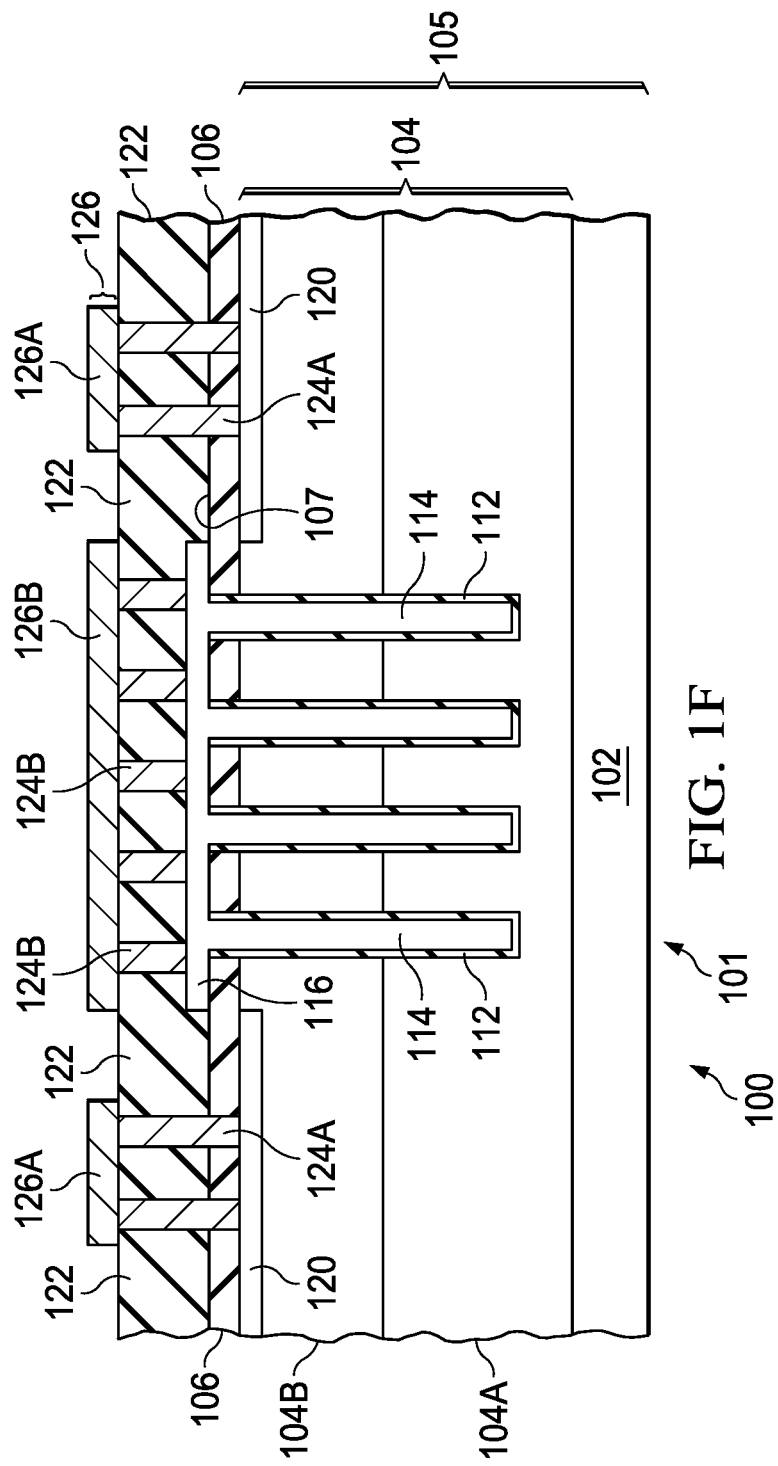

FIG. 1F depicts a cross-section of the integrated circuit 100 and the in-process trench capacitor 101 after deposition of an interconnect dielectric layer 122, sometimes referred to as pre-metal dielectric (PMD) layer 122, and the formation of vias 124 that connect a first metal layer 126 to the substrate contact region 120 and to the polysilicon bridge 116. The process deposits the PMD layer 122 over the polysilicon bridge 116 and over the dielectric layer 106 (if still present) lateral to the polysilicon bridge 116 on the upper surface 107 of the handle substrate 102. The PMD layer 122 can comprise a tetraethoxysilane (TEOS)-derived silicon oxide layer. However, other dielectric layers can also be used for the PMD layer 122, including deposited silicon oxides, such as an organosilicate glass (OSG), a low-k dielectric, a doped dielectric layer such as a fluorine-doped silica glass (FSG), or a SiN layer or its variants (e.g., SiON). The thickness range for the PMD layer 122 in some examples may be from 6,000 Å to 8,000 Å (600 nm to 800 nm).

The process then etches openings for vias 124 in the PMD layer 122 and fills the vias 124. A first metal layer 126 is deposited and patterned to form first metal layer segments 126A and a second metal layer segments 126B over the PMD layer 122. The first metal layer segments 126A are conductively coupled to the substrate contact region 120 through first vias 124A to provide a conductive connection to the bottom plate of the trench capacitor 101. The second metal layer segment 126B is conductively coupled to the polysilicon bridge 116 through second vias 124B, thus providing a conductive connection to the top plate of the trench capacitor 101. The first metal layer 126 can comprise AlCu, typically with 0.5 to 4 wt. % Cu, patterned by subtractive etch. Alternatively, the first metal layer 126 can comprise substantially only copper patterned by a damascene process.

Further processing (not shown) may then be performed to provide a passivation overcoat (PO) layer, including patterning of the PO layer to expose bond pads in the top metal layer. Although the trench capacitor 101 depicted herein has been shown as a standalone capacitor, the integrated circuit 100 may also contain functional circuitry (not shown) that couples to the trench capacitor 101. Such examples may include retaining the photolithography step previously described as possibly being eliminated. When the functional circuitry is present, one or more additional metal levels may be formed subsequent to the processing shown, but prior to the passivation processing.

Figure 2A:
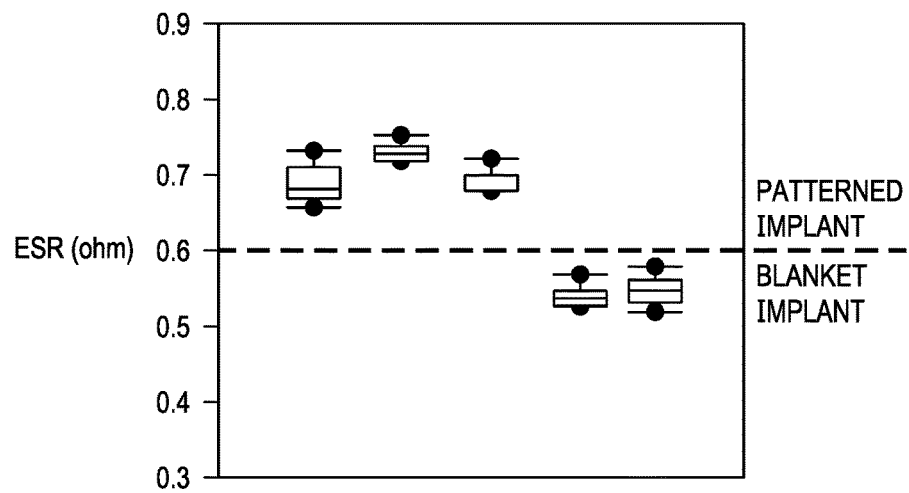
FIG. 2A illustrates the ESR of integrated trench capacitors that are fabricated using a baseline flow of dopant precursor gas, and comparing a patterned implant versus the disclosed blanket implant of dopants.
Figure 2B:
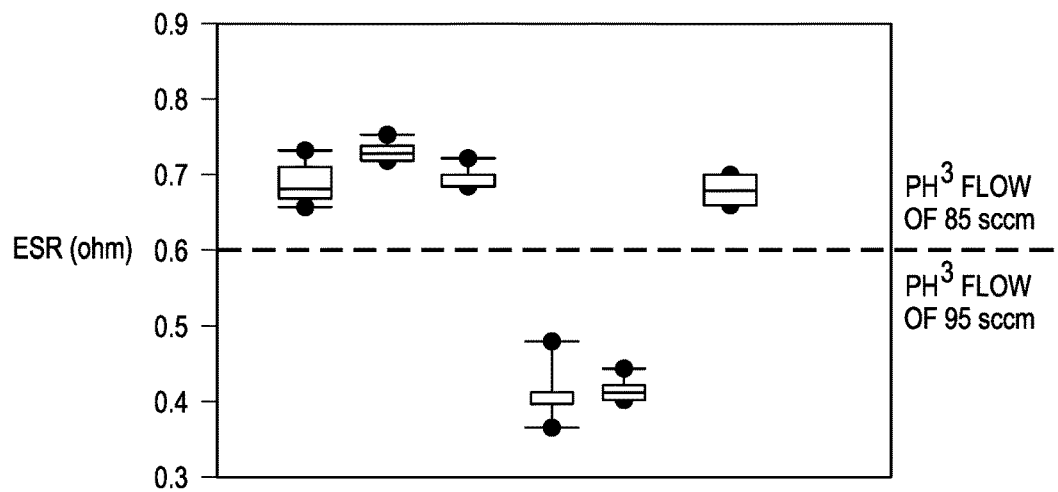
FIG. 2B illustrates the ESR of integrated trench capacitors that are fabricated using a patterned implant and comparing a baseline flow of dopant precursor gas versus an increased flow of dopant precursor gas during polysilicon deposition.
Figure 2C:
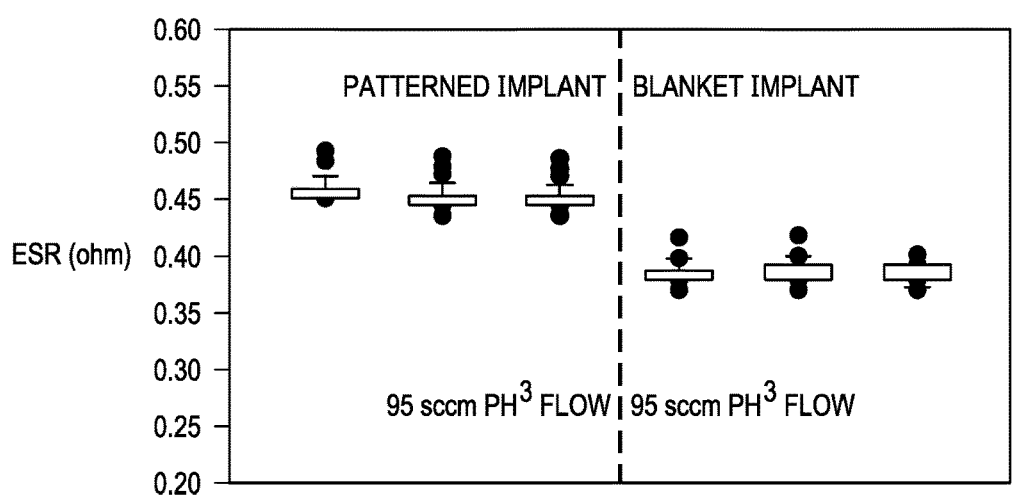
FIG. 2C illustrates the ESR of integrated trench capacitors that are fabricated using the increased flow of dopant precursor gas during polysilicon deposition and comparing the patterned implant versus the blanket implant.

FIGS. 2A-2C provide comparisons between the respective ESRs of trench capacitors using the previously described baseline process and trench capacitors formed consistent with the present disclosure. FIG. 2A presents the ESR of wafers formed using a patterned implant consistent with the described baseline examples, and wafers in which a blanket implant was used to form the substrate contact regions consistent with some described examples. Both sets of wafers used the baseline $PH_3$ flow of 85 sccm. The patterned implants produced wafers having ESRs around 0.7Ω. For those wafers in which a blanket implant was performed to implant both the substrate and the polysilicon bridge, the resistance of the polysilicon bridge was reduced, resulting in a reduction of the ESR to about 5.5Ω. Notably, a mask was also removed from the process, reducing the cost of the process.

FIG. 2B compares the ESR of wafers formed consistent with the described baseline process, and wafers in which the $PH_3$ flow during polysilicon deposition was increased to 95 sccm, vs. 85 sccm as used in some baseline processes. Both sets of wafers used a patterning step to provide patterned implants such as used to produce the substrate contact regions 418 (FIG. 4B). While the ESR of the capacitor formed on the wafers using the baseline process were about 0.7Ω, analogous capacitors fabricated using a higher flow of $PH_3$ such as described for some examples were significantly lower, about 0.45Ω.

FIG. 2C compares wafers formed using a higher flow of $PH_3$, as described for some examples, and a patterned implant to form the substrate contact regions such as used to produce the substrate contact regions 418, versus wafers formed using the higher flow of $PH_3$ and the blanket implant such as used to produce the substrate contact regions 120 in some examples of the disclosure. Both sets of wafers resulted in an ESR of trench capacitors as otherwise described herein less than the desired target of 0.6Ω, with wafers using both a blanket implant consistent with the implant 118 and in situ doping of the polysilicon filler consistent with described examples showing an ESR of about 0.4Ω. Notably, the range of variation across the wafer and across the runs was less in both versions shown in this graph.

Figure 3:
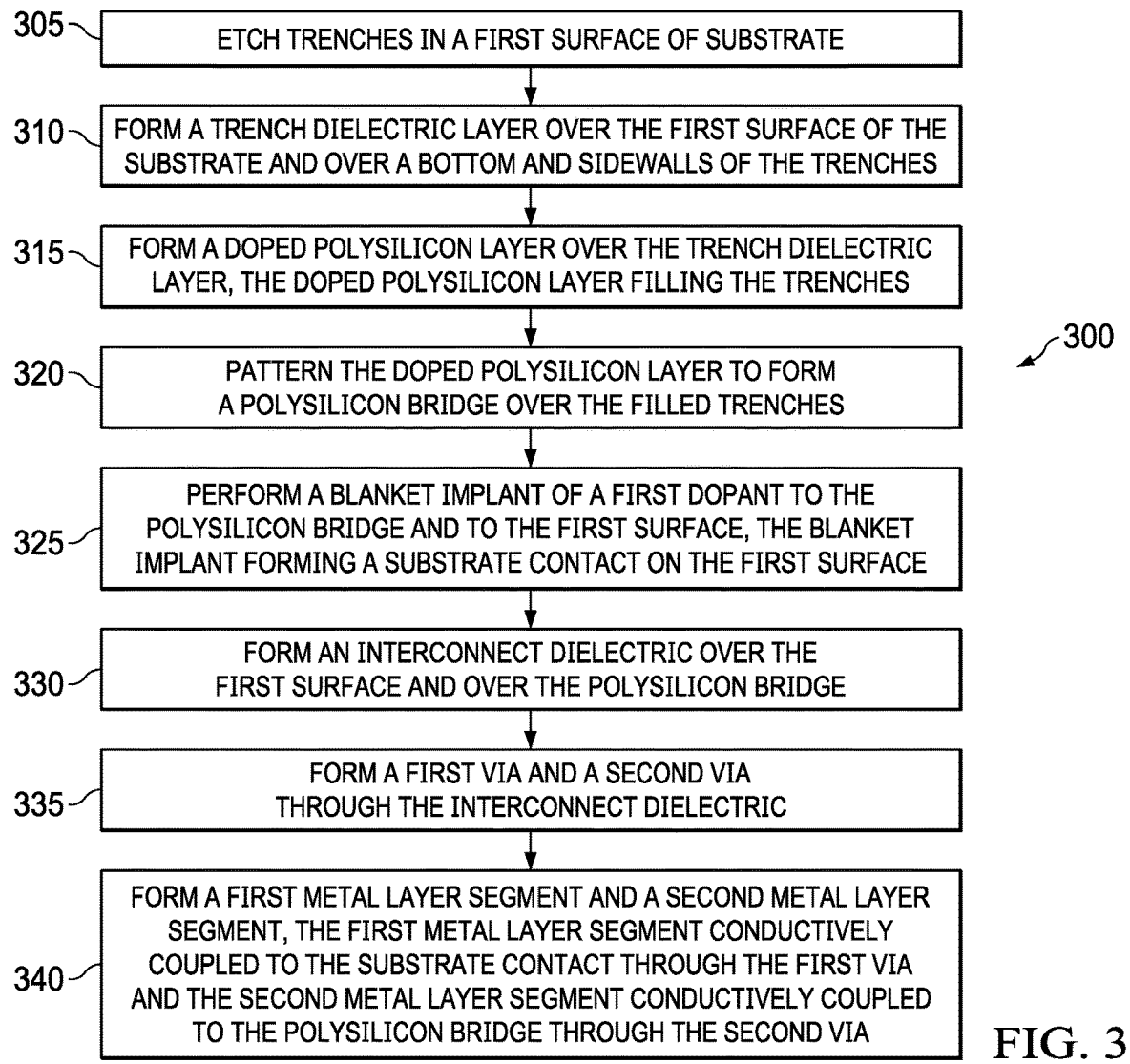
FIG. 3 depicts a method of fabricating an integrated circuit according to an implementation of the disclosure.

FIG. 3 shows a method 300 of fabricating an IC including a trench capacitor according to an implementation of the disclosure. The method 300 is described without implied limitation with respect to the integrated circuit 100. The method begins with etching 305 the trenches 110 in the first surface 107 of the substrate 105. In one implementation, the trenches are etched to a depth of about 10 μm to about 50 μm. In one implementation, the trenches are etched entirely in the epitaxial layer 104 that has been grown over the of substrate 102 that may be a silicon handle wafer. The epitaxial layer may have a same conductivity type as the handle wafer, but an epitaxial dopant concentration in the epitaxial layer is lower than a substrate dopant concentration in the handle wafer.

The trench dielectric layer 112 is then formed 310 over the epitaxial layer 104 and also over a bottom and sidewalls of the trenches 110. In one implementation, the thickness of the trench dielectric layer is about 1000 Å (100 nm) for a 30 V capacitor. In one implementation, the trench dielectric layer can be a thermally grown oxide, or in another implementation, the trench dielectric layer may be an oxide-nitride-oxide layer.

The method then forms the doped polysilicon layer 114 over the trench dielectric layer 112 and fills 315 the trenches. The doped polysilicon layer is generally doped with a dopant that has the same conductivity type as the handle wafer and epitaxial layer. In one implementation, a flow of silane is provided at about 1200 sccm and a flow of the precursor gas including the dopant is provided at about 95 sccm, resulting in the doped polysilicon layer providing a trench dopant concentration of about $3\times10^{20}$ atoms/cm³. The conductivity type may be N-type and the dopant may be, for example, phosphorus or arsenic. Alternatively, the conductivity type may be P-type and the dopant may be, for example, boron or gallium. The doped polysilicon layer is patterned 320 to form the polysilicon bridge 116 over the filled trenches. The polysilicon bridge conductively couples the polysilicon within the trenches to form the top plate of the trench capacitor.

A blanket implant of a first dopant to the polysilicon bridge 116 and to the first surface 107 is performed 325. The blanket implant lowers the resistivity in the polysilicon bridge and forms a substrate contact region, e.g. the substrate contact region 120, that extends from the first surface into the substrate 105. In one implementation, the substrate contact region has a contact dopant concentration of about $1\times10^{20}$ atoms/cm³ and the bridge dopant concentration of the polysilicon bridge has about the same dopant concentration.

A pre-metal dielectric (PMD), or interconnect dielectric, 122 is then formed 330 over the first surface 107 and over the polysilicon bridge 116. The PMD may be a deposited silicon oxide or silicon nitride or a variation of either of these dielectric materials. The vias 124 are formed 335 through the pre-metal dielectric, including a first via and a second via. The first via contacts the substrate contact region and the second via contacts the polysilicon bridge. Finally, the first metal layer 126 is formed and patterned to form 340 the first metal layer segment 126A and a second metal layer segment 126B. The first metal layer segment is conductively coupled to the substrate contact region through the first via and the second metal layer segment is conductively coupled to the polysilicon bridge through the second via.

Applicants have shown a method of fabricating an IC containing a trench capacitor. The method creates a substrate contact region for the trench capacitor using a blanket implant that simultaneously increases the doping in a polysilicon bridge that conductively couples the trenches together and lowers the resistance in the polysilicon bridge. An integrated circuit that is fabricated using the disclosed method has also been shown. Improvements may be obtained to the ESR of the capacitor without the cost of a mask and an existing mask may be removed.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. A method of fabricating an integrated circuit, the method comprising:
    etching trenches in a first surface of a semiconductor layer;
    forming a trench dielectric layer over the first surface and over bottoms and sidewalls of the trenches;
    forming a doped polysilicon layer over the trench dielectric layer and within the trenches;
    patterning the doped polysilicon layer to form a polysilicon bridge that connects to the polysilicon within the trenches; and
    directing a blanket implant of a first dopant to the polysilicon bridge and to the first surface, the blanket implant forming a contact region extending from the first surface into the semiconductor layer.

2. The method as recited in claim 1 including:
    forming an interconnect dielectric layer over the contact region and over the polysilicon bridge;
    forming first and second vias through the interconnect dielectric layer, the first via electrically connecting to the contact region and the second via electrically connecting to the polysilicon bridge; and
    forming first and second metal layer segments over the interconnect dielectric layer, the first metal layer segment electrically connected to the first via and the second metal layer connected to the second via.

3. The method as recited in claim 1 in which the trenches are formed in an epitaxial layer over a handle substrate, the epitaxial layer having a first dopant concentration that is less than a second dopant concentration of the handle substrate.

4. The method as recited in claim 3 in which each of the handle substrate, the epitaxial layer, the doped polysilicon layer, and the first dopant has a same conductivity type.

5. The method as recited in claim 4 in which forming the doped polysilicon layer includes a low pressure chemical vapor deposition process that provides a silane flow rate of about 1200 sccm and a phosphine flow rate of about 95 sccm.

6. The method as recited in claim 4 in which the conductivity type is N-type.

7. The method as recited in claim 5 in which the first dopant includes phosphorus.

8. The method as recited in claim 1 in which forming the trench dielectric layer includes growing a thermal oxide.

9. The method as recited in claim 8 in which the thermal oxide is grown to a depth of about 100 nm.

10. The method as recited in claim 1 in which forming the trench dielectric layer includes forming an oxide-nitride-oxide layer.

11. A method of fabricating an integrated trench capacitor, the method comprising:
    forming plurality of trenches extending from a top surface of a semiconductor substrate into the semiconductor substrate;
    forming a trench dielectric layer on bottoms and sidewalls of the trenches;
    filling the trenches with doped polysilicon and forming a polysilicon bridge that connects to the polysilicon within the filled trenches; and
    directing a blanket implant of a first dopant to the polysilicon bridge and to the top surface, the blanket implant forming a contact region extending from the top surface into the semiconductor substrate.

12. The method as recited in claim 11 in which the blanket implant includes an N-type dopant.

13. The method as recited in claim 12 in which the first dopant includes phosphorus.

14. The method as recited in claim 11 in which the doped polysilicon is formed by a low pressure chemical vapor deposition process that provides a silane flow rate of about 1200 sccm and a phosphine flow rate of about 95 sccm.

15. The method as recited in claim 11 in which forming the trench dielectric layer includes growing a thermal oxide.

16. The method as recited in claim 15 in which the thermal oxide is grown to a thickness of about 100 nm.

17. The method as recited in claim 11 in which the trench dielectric layer includes an oxide-nitride-oxide (ONO) layer.

18. The method as recited in claim 11, further comprising forming an interconnect dielectric layer over the top surface and the polysilicon bridge, and a first terminal through the interconnect dielectric layer to the contact region and a second terminal through the interconnect dielectric layer to the polysilicon bridge.

* * * * *